United States Patent
Shu et al.

(10) Patent No.: US 11,656,727 B2
(45) Date of Patent: May 23, 2023

(54) TOUCH ELECTRODE STRUCTURE AND MANUFACTURE METHOD THEREOF, TOUCH PANEL, AND ELECTRONIC DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Xiaoqing Shu, Beijing (CN); Jiping Zhao, Beijing (CN); Yunsheng Xiao, Beijing (CN); Xiangdan Dong, Beijing (CN); Fan He, Beijing (CN); Zhengwei Luo, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 389 days.

(21) Appl. No.: 16/977,895

(22) PCT Filed: Nov. 28, 2019

(86) PCT No.: PCT/CN2019/121599
§ 371 (c)(1),
(2) Date: Sep. 3, 2020

(87) PCT Pub. No.: WO2021/102798
PCT Pub. Date: Jun. 3, 2021

(65) Prior Publication Data
US 2022/0404929 A1    Dec. 22, 2022

(51) Int. Cl.
*G06F 3/044*    (2006.01)
*G06F 3/041*    (2006.01)

(52) U.S. Cl.
CPC .......... *G06F 3/0445* (2019.05); *G06F 3/0412* (2013.01); *G06F 3/0446* (2019.05); *G06F 3/0448* (2019.05)

(58) Field of Classification Search
CPC .... G06F 3/0445; G06F 3/0446; G06F 3/0448; G06F 3/0412
See application file for complete search history.

(56) References Cited

U.S. PATENT DOCUMENTS

| 2011/0007030 A1 | 1/2011 | Mo et al. |
| 2015/0004760 A1 | 1/2015 | Kim et al. |

(Continued)

FOREIGN PATENT DOCUMENTS

| CN | 206162477 U | 5/2017 |
| CN | 107688410 A | 2/2018 |

(Continued)

OTHER PUBLICATIONS

Extended European Search Report from European Patent Application No. 19945400.0 dated Nov. 14, 2022.

*Primary Examiner* — Deeprose Subedi
(74) *Attorney, Agent, or Firm* — Dilworth & Barrese, LLP.; Michael J. Musella, Esq.

(57) ABSTRACT

A touch electrode structure and a manufacture method thereof, a touch panel, and an electronic device are provided. The touch electrode structure includes a first touch electrode and a second touch electrode intersecting with each other to form a mutual capacitance for touch detection; the first touch electrode is longer than the second touch electrode; the first touch electrode includes a first hollow region, the second touch electrode includes a second hollow region, and a hollow area of the first touch electrode is greater than that of the second touch electrode; and the touch electrode structure further includes at least one first dummy electrode, which is (Continued)

within the first hollow region and is arranged in a same layer as at least part of the first touch electrode, and they are insulated from each other.

18 Claims, 8 Drawing Sheets

(56) References Cited

U.S. PATENT DOCUMENTS

| | | |
|---|---|---|
| 2018/0164931 A1 | 6/2018 | Na et al. |
| 2019/0087033 A1 | 3/2019 | Son et al. |
| 2020/0167039 A1 | 5/2020 | Deng et al. |
| 2020/0333918 A1* | 10/2020 | Lin .................... G06F 3/0446 |

FOREIGN PATENT DOCUMENTS

| | | |
|---|---|---|
| CN | 107894863 A | 4/2018 |
| CN | 108646952 A | 10/2018 |
| CN | 109656407 A | 4/2019 |
| CN | 110471568 A | 11/2019 |

\* cited by examiner

TOUCH ELECTRODE STRUCTURE AND MANUFACTURE METHOD THEREOF, TOUCH PANEL, AND ELECTRONIC DEVICE

TECHNICAL FIELD

Embodiments of the present disclosure relate to a touch electrode structure and a manufacture method thereof, a touch panel, and an electronic device.

BACKGROUND

A user interface with touch functions is widely used in various electronic devices, and a touch electrode structure has a great influence on the touch sensitivity.

SUMMARY

At least one embodiment of the present disclosure provides a touch electrode structure, comprising a first touch electrode and a second touch electrode, wherein the first touch electrode extends along a first direction, the second touch electrode extends along a second direction, the first direction intersects with the second direction, and a size of the first touch electrode in the first direction is greater than a size of the second touch electrode in the second direction; the first touch electrode and the second touch electrode are insulated from and intersect with each other to form a mutual capacitance for touch detection; the first touch electrode comprises a first hollow region, the second touch electrode comprises a second hollow region, and a hollow area of the first touch electrode is greater than a hollow area of the second touch electrode; and the touch electrode structure further comprises at least one first dummy electrode, the at least one first dummy electrode is within the first hollow region and is arranged in a same layer as at least part of the first touch electrode, and the at least one first dummy electrode and the at least part of the first touch electrode are insulated from each other.

In some embodiments, the first hollow region comprises a plurality of first sub-hollow regions spaced apart from each other, and the touch electrode structure further comprises a plurality of first dummy electrodes which are respectively within the plurality of first sub-hollow regions.

In some embodiments, the touch electrode structure according to claim 1, wherein an area of the second hollow region is 0.

In some embodiments, the second hollow region comprises a plurality of second sub-hollow regions spaced apart from each other, and the touch electrode structure further comprises a plurality of second dummy electrodes which are respectively within the plurality of second sub-hollow regions.

In some embodiments, areas of the plurality of first sub-hollow regions are identical, and areas of the plurality of second sub-hollow regions are identical.

In some embodiments, an amount of the plurality of first sub-hollow regions is identical to an amount of the plurality of second sub-hollow regions, and an area of each first sub-hollow region is greater than an area of each second sub-hollow region.

In some embodiments, an amount of the plurality of first sub-hollow regions is greater than an amount of the plurality of second sub-hollow regions, and an area of each first sub-hollow region is identical to an area of each second sub-hollow region.

In some embodiments, the first touch electrode comprises a plurality of first touch electrode portions connected in sequence in the first direction, and the second touch electrode comprises a plurality of second touch electrode portions connected in sequence in the second direction; and the plurality of first sub-hollow regions are within the plurality of first touch electrode portions, and the plurality of first dummy electrodes and the plurality of first touch electrode portions are arranged in a same layer and insulated from each other.

In some embodiments, the first touch electrode and the second touch electrode form a plurality of touch units at intersections, and each touch unit comprises at least one part of each of two first touch electrode portions connected at the intersections and a part of each of two second touch electrode portions connected at the intersections; and for each touch unit, a total hollow area of the two first touch electrode portions is greater than a total hollow area of the two second touch electrode portions.

In some embodiments, for each first touch electrode portion, a ratio of the hollow area to an electrode area of the first touch electrode portion ranges from 0.1 to 1.

In some embodiments, each first dummy electrode comprises a plurality of first interdigital structures, and each first interdigital structure and the first touch electrode portion where the first interdigital structure is embedded in are in a same plane.

In some embodiments, each first dummy electrode comprises a first body portion connected to the plurality of first interdigital structures, and the first body portion comprises a plurality of edges, and each edge corresponds to at least two first interdigital structures.

In some embodiments, at least one first touch electrode portion where the first dummy electrode is located comprises a plurality of second interdigital structures, and the at least one first touch electrode portion is interdigitated with second touch electrode portions adjacent to the at least one first touch electrode portion in the same plane through the plurality of second interdigital structures to form the mutual capacitance.

In some embodiments, an extending direction of at least one first interdigital structure of the first dummy electrode and an extending direction of at least one second interdigital structure of the first touch electrode portion where the first dummy electrode is located are parallel to each other.

In some embodiments, on each edge of the first body portion of the first dummy electrode, one of two adjacent first interdigital structures points to one of the plurality of second interdigital structures, and the other of the two adjacent first interdigital structures points to a gap between the two adjacent second interdigital structures.

In some embodiments, the first touch electrode portion further comprises a second body portion connected to the plurality of second interdigital structures, and the second body portion comprises a plurality of edges, and an amount of second interdigital structures corresponding to each edge ranges from 3 to 10.

In some embodiments, an average width of each second interdigital structure ranges from $1/10$ to $1/4$ of a center distance between adjacent first touch electrode portions.

In some embodiments, an average length of each second interdigital structure ranges from $1/10$ to $1/3$ of a center distance between adjacent first touch electrode portions.

In some embodiments, a shape of the first interdigital structure is at least one selected from: rectangle, triangle and trapezoid.

In some embodiments, adjacent first touch electrode portions are electrically connected through a first connection portion to form the first touch electrode, and adjacent second touch electrode portions are electrically connected through a second connection portion to form the second touch electrode; and the first touch electrode portion, the second touch electrode portion and the first connection portion are arranged in a same layer and made of a same material, and are separated from the second connection portion by an insulating layer, and adjacent first touch electrode portions are electrically connected by the second connection portion through a via in the insulating layer.

In some embodiments, the first touch electrode portion and the second touch electrode portion are both made of transparent conductive materials, or both comprise a metal grid structure.

At least one embodiment of the present disclosure provides a touch panel, comprising the touch electrode structure as described above.

At least one embodiment of the present disclosure provides an electronic device, comprising the touch electrode structure or the touch panel as described above.

In some embodiments, further comprising a display panel, wherein the display panel comprises a substrate, a light-emitting element on the substrate, and an encapsulation layer on a side of the light-emitting element away from the substrate; and the touch electrode structure is on a side of the encapsulation layer away from the substrate.

At least one embodiment of the present disclosure provides a manufacture method for manufacturing a touch electrode structure, comprising forming a first touch electrode and a second touch electrode, wherein the first touch electrode extends along a first direction, the second touch electrode extends along a second direction, and the first direction intersects with the second direction; a size of the first touch electrode in the first direction is greater than a size of the second touch electrode in the second direction; the first touch electrode and the second touch electrode intersect with each other to form a mutual capacitance for touch detection; the first touch electrode comprises a first hollow region, the second touch electrode comprises a second hollow region, and a hollow area of the first touch electrode is greater than a hollow area of the second touch electrode; and the touch electrode structure further comprises at least one first dummy electrode, the at least one first dummy electrode is within the first hollow region and is arranged in a same layer as at least part of the first touch electrode, and the at least one first dummy electrode and the at least part of the first touch electrode are insulated from each other.

BRIEF DESCRIPTION OF THE DRAWINGS

In order to clearly illustrate the technical solutions of the embodiments of the present disclosure, the drawings of the embodiments will be briefly described hereinafter. It is obvious that the described drawings are only related to some embodiments of the present disclosure and are not limitative to the present disclosure.

DETAILED DESCRIPTION

Figure 1:
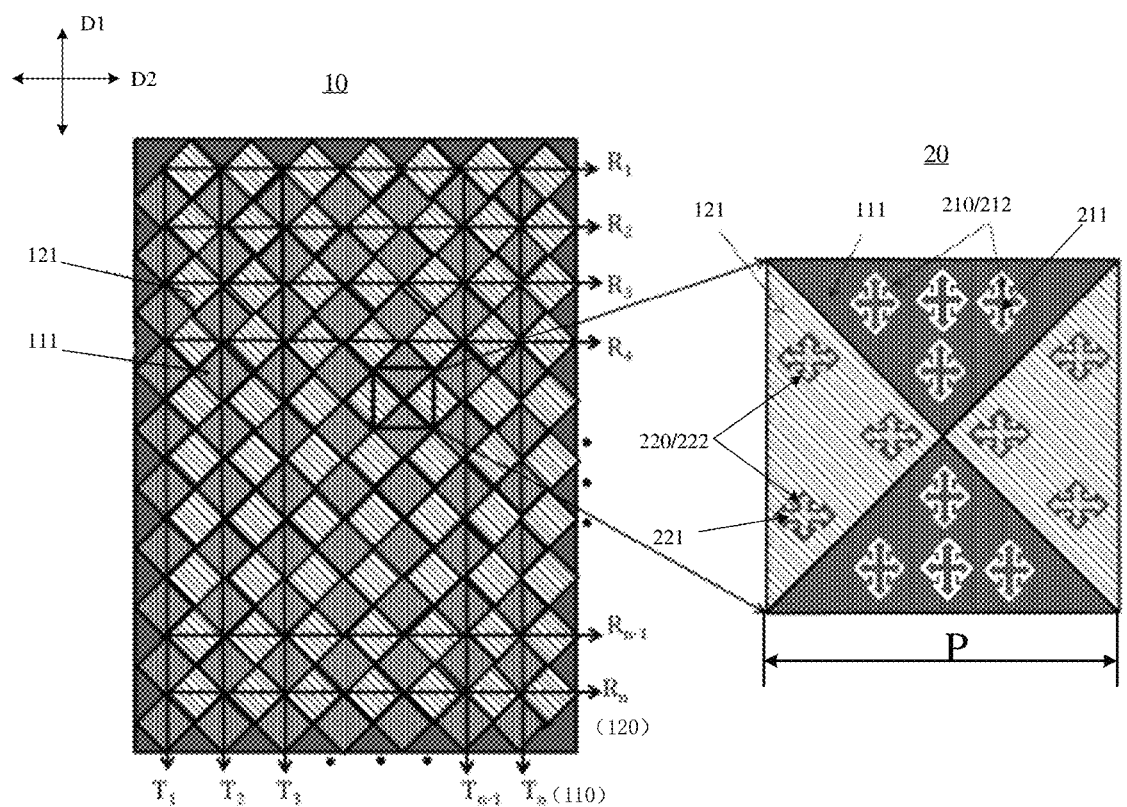
FIG. 1 is a schematic diagram of a touch electrode structure provided by embodiments of the present disclosure.

In connection with the attached drawings, the technical solutions of the embodiments will be clearly and completely described with reference to the non-limiting example embodiments shown in the drawings and detailed in the following description, and the example embodiments of this present disclosure and their various features and advantageous details are more fully explain. It should be noted that the features shown in the figures are not necessarily drawn to scale. This present disclosure omits descriptions of known materials, components, and process techniques so as not to obscure example embodiments of the present disclosure. The examples given are only intended to facilitate understanding of the implementation of the exemplary embodiments of the present disclosure and further enable those skilled in the art to implement the exemplary embodiments. Therefore, these examples should not be understood as limiting the scope of the embodiments of the present disclosure.

Unless otherwise defined, the technical terms and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Furthermore, in various embodiments of the present disclosure, the same or similar reference numerals refer to the same or similar components.

A mutual capacitance type of touch electrode structure includes a touch driving electrode and a touch sensing electrode, the touch driving electrode and the touch sensing electrode form a mutual capacitance for touch detection, the touch driving electrode is used for inputting excitation signals (touch driving signals), and the touch sensing electrode is used for outputting touch sensing signals. By inputting an excitation signal to, for example, a longitudinally extending touch driving electrode and receiving a touch sensing signal from, for example, a transversely extending touch sensing electrode, a capacitance value of a coupling point (for example, an intersection point) of a transverse electrode and a longitudinal electrode can be obtained. In the case where a finger touches the capacitive screen, it affects the coupling between the touch driving electrode and the touch sensing electrode, thus changing the capacitance between the two electrodes. According to the two-dimensional capacitance variation data of a touch screen, coordinates of respective touch points (intersection points) can be calculated.

The load (such as resistance-capacitance load) on the touch electrode will directly affect the transmission speed of a signal and the accuracy of a touch signal, thus affecting the touch sensitivity of the touch electrode structure. The inventors found that a touch region is usually rectangular, and one of the touch driving electrode and the touch sensing electrode extends along a length direction of the rectangle, while the other extends along a width direction of the rectangle. The touch electrode extending along the length direction is longer, so the load is larger. In order to improve the touch sensitivity of the touch electrode structure, it is necessary to reduce the load on the touch electrode.

Embodiments of the present disclosure provide a touch electrode structure, a first touch electrode includes a first hollow region, and a second touch electrode includes a second hollow region. The touch electrode structure also includes at least one first dummy electrode, which is located within the first hollow region and is arranged on the same layer as at least part of the first touch electrode and insulated from each other.

Self-capacitance (parasitic capacitance) on the first touch electrode can be effectively and pertinently reduced by setting a hollow region on the long first touch electrode and setting the hollow region on the first touch electrode greater than a hollow region on the second touch electrode, thereby improving the touch sensitivity of the touch electrode structure. In addition, by arranging the dummy electrode in a same layer as the touch electrode in the hollow region, the uniformity of a film layer can be improved, thereby improving the product yield.

FIG. 1 is a touch electrode structure 10 provided by embodiments of the present disclosure. As shown in FIG. 1, the touch electrode structure includes a plurality of first touch electrodes 110 (T1-Tn) extending along a first direction D1 and a plurality of second touch electrodes 120 (R1-Rn) extending along a second direction D2, and the first direction D1 intersects with the second direction D2, for example, the first direction D1 is perpendicular to the second direction D2. A size (length) of the first touch electrode 110 in the first direction D1 is greater than a size (length) of the second touch electrode 120 in the second direction, so a load of the first touch electrode 110 is greater than a load of the second touch electrode. For example, a length of the first touch electrode 110 is about twice a length of the second touch electrode 120. The term "about" here means approximately and not exactly, and measurement errors within allowable ranged is permitted. For example, about twice the length may indicate 1.98 or 2.1 times of the length.

For example, the first touch electrode 110 is the touch driving electrode, and the second touch electrode 120 is the touch sensing electrode. However, the embodiments of the present disclosure are not limited to this case. In other examples, the first touch electrode 110 may be the touch sensing electrode and the second touch electrode 120 may be the touch driving electrode.

Each first touch electrode 110 includes first touch electrode portions 111 arranged in sequence along the first direction D1 and connected to each other, and each second touch electrode 120 includes second touch electrode portions 121 arranged in sequence along the second direction D2 and connected to each other. As shown in FIG. 1, each first touch electrode portion 111 and each second touch electrode portion 121 is rhombic. In other examples, the first touch electrode portion 111 and the second touch electrode portion 121 can also have other shapes, such as, triangles, strips, and the like.

Figure 3A:
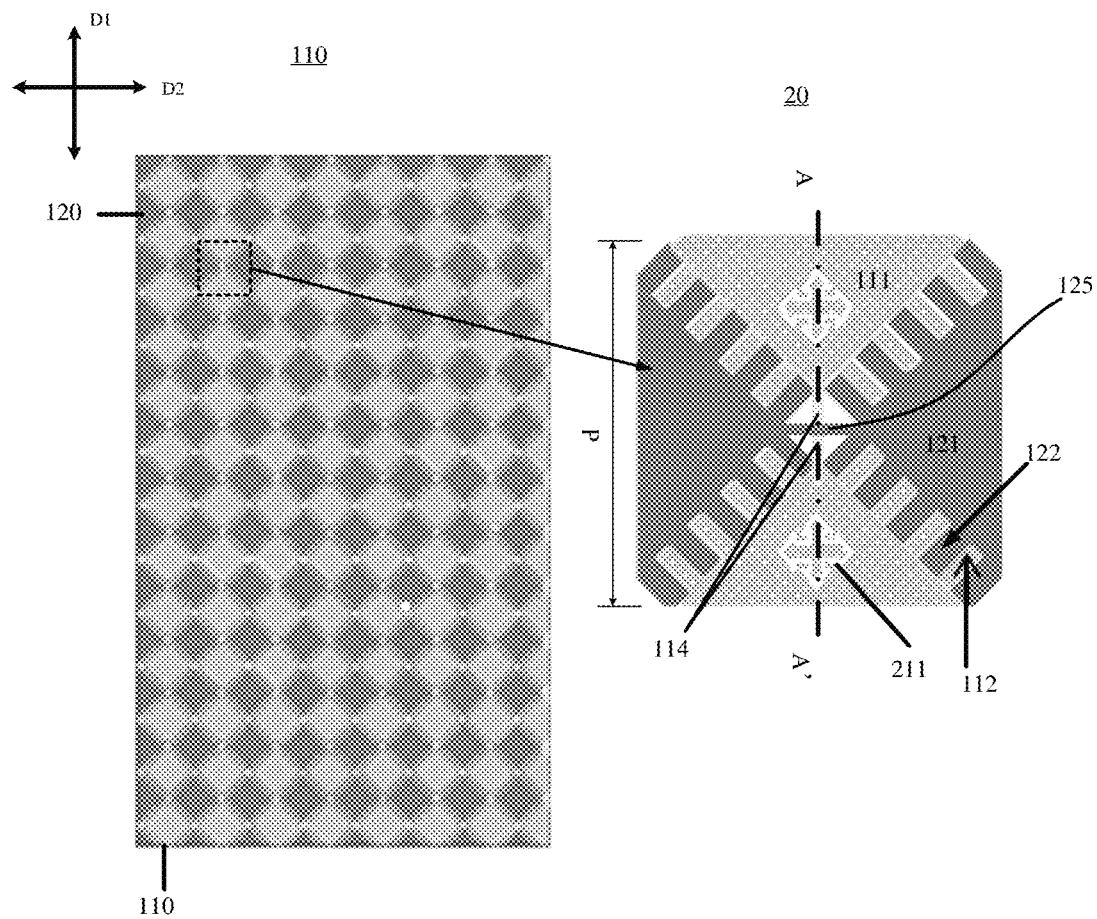
FIG. 3A is a schematic diagram of a touch electrode structure provided by other embodiments of the present disclosure.
Figure 3B:
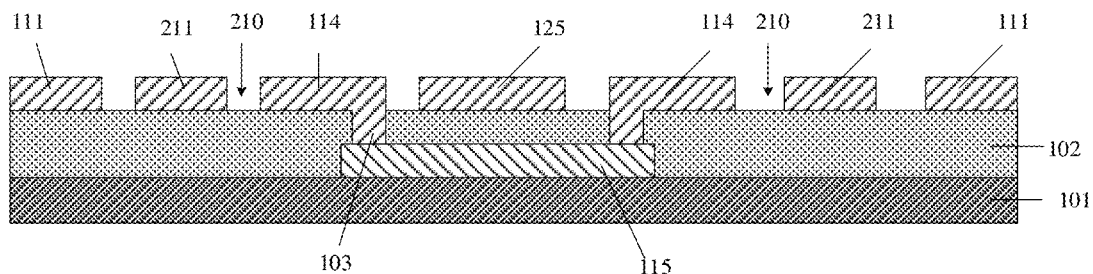
FIG. 3B is a sectional view of FIG. 3A taken along a section line A-A'.

The touch electrode structure 10 further includes a first connection part and a second connection part (not shown), first touch electrode portions 111 which are adjacent in the first direction D1 are electrically connected through the first connection part, so as to form the first touch electrode 110, and second touch electrode portions 121 which are adjacent in the second direction D2 are electrically connected through the second connection part, so as to form the second touch electrode 120. Details can be referred to the description of FIG. 3A and FIG. 3B provided hereinafter.

Each first touch electrode 110 and each second touch electrode 120 are insulated from and intersect with each other to form a plurality of touch units 20 at intersections, and each touch unit includes a part of each of two first touch electrode portions connected at the intersections and at least one part of each of two second touch electrode portions connected at the intersections. FIG. 1 shows an enlarged schematic diagram of a touch unit 20 on a right side. As shown in the figure, each touch unit 20 includes half regions of two first touch electrode portions 111 adjacent to each other and half regions of two second touch electrode portions 121 adjacent to each other, that is, a region including one first touch electrode portion 111 and one second touch electrode portion 121 on average, and the intersection of the first touch electrode portion 111 and the second touch electrode portion 121 in each touch unit 20 (that is, the intersection of the first connection part and the second connection part) forms a reference point for calculating coordinates. In the case where a finger touches a capacitive screen, it affects the coupling between the first touch electrode and the second touch electrode near a touch point, thus changing the mutual capacitance between the two electrodes. According to the capacitance variation data of the touch screen, the coordinates of each touch point can be calculated based on the reference point. For example, an area of each touch unit 20 is equal to an area where a user's finger contacts the touch panel. If the area of the touch unit is too large, it may cause a touch blind spot on the panel, and if the area of the touch unit is too small, it may cause a false touch signal.

An average edge length of each touch unit 20 is P, which is called a pitch of the touch electrode structure. For example, the pitch P ranges from about 3.7 mm to about 5 mm, for example, about 4 mm; this is because a diameter of the user's finger in contact with the touch panel is about 4 mm. The term "about" here means approximately and not exactly, and measurement errors within allowable ranged is permitted. For example, about 3.7 mm may include 3.67 mm, and about 5 mm may include 5.02 mm. For example, the pitch is the same as an average edge length of each first touch electrode portion 111 and an average edge length of each second touch electrode portion 121, and also is the same as a center distance between adjacent first touch electrode portions 111 and a center distance between adjacent second touch electrode portions 121.

As shown in FIG. 1, the first touch electrode 110 includes a first hollow region 210, and the second touch electrode 120 includes a second hollow region 220. By setting the hollow area, an electrode area (effective area) and parasitic capacitance (self-capacitance) of the touch electrode are reduced, thus reducing the load on the touch electrode.

A hollow area of the first touch electrode 110 (that is, a total area of the first hollow region 210) is greater than a hollow area of the second touch electrode 120 (that is, a total area of the second hollow region 220), because the load on the first touch electrode is greater than the load on the second touch electrode, which directly affects the accuracy of touch signal sensing.

In some examples, only the first touch electrode 110 may be provided with a hollow region, and it is not necessary to provide a hollow region on the second touch electrode 120, that is, the area of the hollow region 220 on the second touch electrode 120 is 0, which can simplify the process.

In some examples, for each touch unit 20, the hollow area of the first touch electrode portion 111 (total hollow area of the two first touch electrode portions 111) in the touch unit 20 is greater than that of the second touch electrode portion 121 (total hollow area of the two second touch electrode portions 121).

For example, hollow areas of respective first touch electrode portions 111 are the same as each other. Hollow areas of respective second touch electrode portions 121 are the same as each other. The hollow area of each first touch electrode portion 111 is greater than the hollow area of the second touch electrode portion 121.

In other examples, for each first touch electrode 110, hollow regions with different densities may also be arranged in different regions. For example, in the case where the touch electrode structure 10 is applied to a curved touch panel or a flexible touch panel, the region of the first touch electrode 110 corresponding to a bending region can be provided with a higher density of hollow regions than a planar region. Here, the term "density" may indicate how many hollow areas there are per unit area. For example, if a gap between adjacent hollow areas is smaller, then the density of hollow regions is higher, provided that the hollow areas are identical. This is because the bending lengthens the power lines between the touch electrodes forming the mutual capacitance, so that an equivalent distance between the touch electrodes is lengthened, so the capacitance value of the mutual capacitance becomes smaller, which reduces the touch sensitivity of the bending region. By setting a higher density hollow area in the bending region, the touch sensitivity of the touch panel in the bending region can be improved. For example, the hollow area of the first touch electrode portion 111 located within the bending region is greater than the hollow area of the first touch electrode portion 111 located within the plane region.

Corresponding to the hollow region, the touch electrode structure 10 further includes at least one first dummy electrode 211. The at least one first dummy electrode 211 is located within the first hollow region 210 of the first touch electrode 110, and is arranged in the same layer as at least part of the first touch electrode 110, and the at least one first dummy electrode 211 and the at least part of the first touch electrode 110 are insulated from each other. For example, the first dummy electrode 211 and a part of the first touch electrode 110 adjacent to the first dummy electrode 211 are arranged in the same layer. For example, each first dummy electrode 211 is insulated from the first touch electrode portion 111 and is in the same layer as the first touch electrode portion 111.

For example, the touch electrode structure 10 may further include at least one second dummy electrode 221, the at least one second dummy electrode 221 is located within the second hollow region 220 of the second touch electrode 120, and is arranged in the same layer as at least part of the second touch electrode 120, and the at least one second dummy electrode 221 and the at least part of the second touch electrode 120 insulated from each other. For example, the second dummy electrode 221 and a part of the second touch electrode 120 adjacent to the second dummy electrode 221 are arranged in the same layer. For example, each second dummy electrode 221 is insulated from and in the same layer as the second touch electrode portion 121.

It should be noted that "arranged in the same layer" in this present disclosure means that two or more structures are formed by the same film layer through the same or different patterning processes, so the materials are the same.

For example, the first dummy electrode 211 and the second dummy electrode 221 are in a floating state, for example, they are not electrically connected to other structures or do not receive any electrical signals.

For example, as shown in FIG. 1, the first hollow region 210 may include a plurality of first sub-hollow regions 212 spaced apart from each other; the plurality of first dummy electrodes 211 are respectively arranged in the plurality of first sub-hollow regions 212 in a one-to-one correspondence. The second hollow region 220 may include a plurality of second sub-hollow regions 222 spaced apart from each other. The plurality of second dummy electrodes 221 are respectively arranged in the plurality of second sub-hollow regions 222 in a one-to-one correspondence. The hollow regions are scattered in multiple regions, so as to avoid the touch blind spot caused by the oversized area of a single hollow region. For example, the arrangements of the first sub-hollow regions 212 in respective first touch electrode portions 111 are the same. For example, the arrangements of the second sub-hollow regions 222 in respective second touch electrode portions 121 are the same.

For example, the areas of the first sub-hollow regions 212 are the same, and the areas of the second sub-hollow regions 222 are the same.

For example, an amount of the first sub-hollow regions 212 is the same as an amount of the second sub-hollow regions 222, and the area of each first sub-hollow region 212 is greater than the area of each second sub-hollow region 222.

For example, the amount of the first sub-hollow regions 212 is greater than the amount of the second sub-hollow regions 222, and the area of each first sub-hollow region 212 is the same as the area of each second sub-hollow region 222. For example, a total amount of the first sub-hollow regions 212 is 1.5 times, 2 times or 3 times of a total amount of the second sub-hollow regions 222. For example, for each touch unit 20, the amount of the first sub-hollow regions 212 is 1.5 times, 2 times or 3 times the amount of the second sub-hollow regions 222.

For example, as shown in FIG. 1, the plurality of first sub-hollow regions 212 are distributed within the first touch electrode portion 111. For example, for each first touch electrode portion 111, a ratio of the hollow area to the electrode area (effective area) of the first touch electrode portion ranges from 0.1 to 1. If the hollow area is too small, it will not improve the touch sensitivity, while if the hollow area is too large, it will cause touch blind spots and reduce the touch sensitivity. For example, for each first touch electrode portion 111, the hollow area is the same as the electrode area of the first touch electrode portion 111. For example, for each first touch electrode portion 111, the hollow area is slightly less than the electrode area of the first touch electrode portion 111, for example, the ratio of the hollow area to the electrode area of the first touch electrode portion 111 is 45:55.

For example, each dummy electrode has the same outline as the hollow region where the dummy electrode is located, that is, the dummy electrode is embedded in the touch electrode where the dummy electrode is located; a boundary region exists between the dummy electrode and the touch electrode, and the dummy electrode and the touch electrode are insulated from each other by the boundary region. An average size of the boundary region (a average distance between the dummy electrode and the touch electrode) is a minimum size that satisfies the design rule, for example, 3 microns to 6 microns. In this way, the uniformity of the electrode film can be improved and the process yield can be improved. For example, a first boundary region (gap) between each first dummy electrode 211 and the first touch electrode 110 in which the first dummy electrode 211 is embedded has the same size, and a second boundary region between each second dummy electrode 221 and the second touch electrode 120 in which the second dummy electrode 211 is embedded has the same size. For example, the first boundary region and the second boundary region have the same size.

For example, the boundary region extends along a curve, that is, the outline of the dummy electrode has a curved structure. For example, the outline includes a sawtooth structure. Such a design enables the region involved by dummy electrodes larger under the same area. Due to the dummy electrodes embedded in the touch electrodes, the region affected by touch electrodes is relatively larger, which can avoid touch blind spots caused by excessive concentration of dummy electrodes. In addition, because the dummy electrode are embedded in the touch electrode, that is, an inner outline of the touch electrode is also a curved structure, this structure can increase a perimeter of the inner outline compared with a straight linear structure, thereby increasing the mutual capacity of the touch electrode.

Figure 2A:
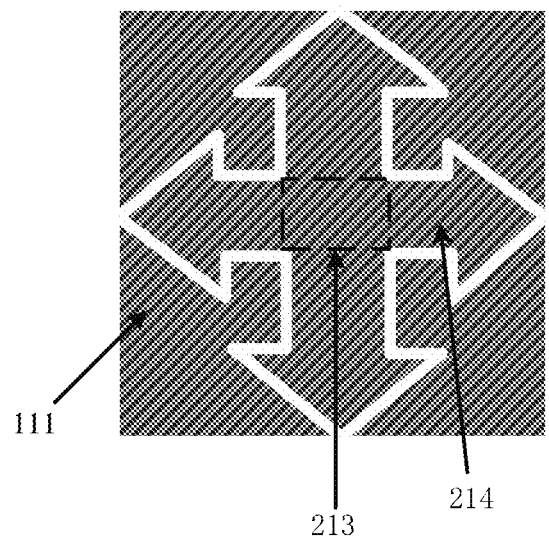
FIGS. 2A-2C are schematic diagrams of dummy electrodes provided by embodiments of the present disclosure.
Figure 2B:
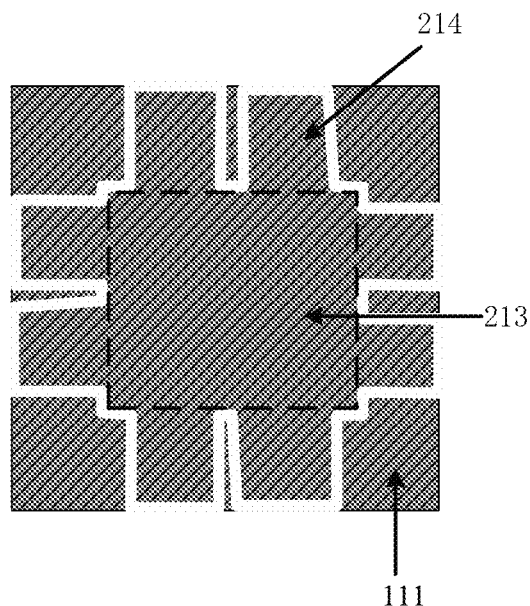
Figure 2C:
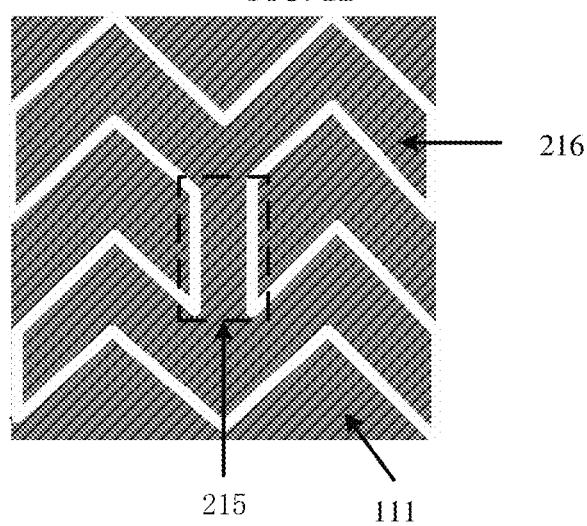

FIGS. 2A-2C schematically show different examples of enlarged schematic diagrams of dummy electrodes, respectively. Hereinafter, the first dummy electrode 211 will be taken as an example to illustrate the dummy electrode in the present disclosure, and this case is also applicable to the second dummy electrode 221. As shown in FIG. 2A, each first dummy electrode 211 includes a first body portion 213 and a plurality of first interdigital structures 214 connected to the first body portion 213, and the plurality of first interdigital structures are uniformly arranged around the first body portion 213. For example, each first interdigital structure 214 may further include a sawtooth structure. As shown in FIG. 2B, for example, the first body portion 213 includes a plurality of edges, such as a rectangle, and an amount of first interdigital structures corresponding to each edge is at least 2. For example, the shape of the first interdigital structure 214 includes at least one of rectangle, triangle, and trapezoid.

In another example, as shown in FIG. 2C, each first dummy electrode 221 includes a plurality of sawtooth strips 216 connected by connection portions 215, for example, each sawtooth strip is W-shaped.

For example, the mutual capacity between the first touch electrode 110 and the second touch electrode 120 can be improved by providing an interdigital structure in the touch electrode portion, thereby improving touch sensitivity. In each touch unit 20, the first touch electrode 110 and the second touch electrode 120 are coupled at the intersection to form the mutual capacitance, and the first touch electrode 110 and the second touch electrode 120 are also coupled at adjacent (opposite) positions to form the mutual capacitance, which contributes to the touch sensing of the touch unit 20. Increasing the coupling region between the first touch electrode 110 and the second touch electrode 120, that is, increasing the edge length of the first touch electrode 110 and the second touch electrode 120 opposite to each other, can effectively improve the mutual capacitance between the first touch electrode 110 and the second touch electrode 120, thus improving the touch sensitivity.

FIG. 3A shows a schematic diagram of a touch electrode structure provided by other embodiments of the present disclosure. As shown in FIG. 3A, at least one first touch electrode portion 111 includes a plurality of second interdigital structures 112, and a first touch electrode portion 111 is interdigitated with second touch electrode portions 121 adjacent to the first touch electrode portion 111 in the same plane to form the mutual capacitance. That is, the second touch electrode portion 121 interdigitated with the first touch electrode portion 111 also has an interdigital structure (third interdigital structure) 122. The interdigital structure can increase the perimeter of the touch electrode part in case of the same area, so the mutual capacitance can be effectively improved without increasing the self-capacitance (parasitic capacitance) of the touch electrode part, thereby improving the touch sensitivity.

For example, first touch electrode portions 111 adjacent in the first direction D1 are connected by the first connection portions (not shown in FIG. 3A) to form the first touch electrodes 110 extending in the first direction D1, and second touch electrode portions 121 adjacent in the second direction D2 are connected by the second connection portions 125 to form the second touch electrodes 120 extending in the second direction D2. As shown in FIG. 3A, each first touch electrode portion 111 further includes an electrode connection portion 114 for connecting with the first connection portion.

For example, the first touch electrode portion 111 and the second touch electrode portion 121 are arranged in the same layer, is arranged in the same layer as one of the first connection part and the second connection part 125, and are separated from the other by an insulating layer and is electrically connected to the other through a via in the insulating layer.

FIG. 3B shows an example of the sectional view of FIG. 3A taken along a sectional line A-A'. As shown in FIG. 3B, the touch electrode structure 10 is disposed on a base substrate 101, for example, the base substrate 101 may be a rigid substrate (e.g., a glass substrate) or a flexible substrate (e.g., an organic flexible substrate). The first touch electrode portion 111, the second touch electrode portion 121 and the second connection portion 125 are arranged in the same layer and made of the same material, and are separated from the first connection portion 115 by the insulating layer 102. For example, the first connection portion 115 is closer to the base substrate 101 than the second connection portion 125. The first connection portion 115 is electrically connected to the first touch electrode portion 111 through the via 103 in the insulating layer 102, thereby electrically connecting the first touch electrode portions 111 adjacent in the first direction D1 to form the first touch electrode 110. The second connection portion 125 and the first connection portion 115 overlap each other in a direction perpendicular to the base substrate 101 to form the mutual capacitance for touch detection.

Figure 4A:
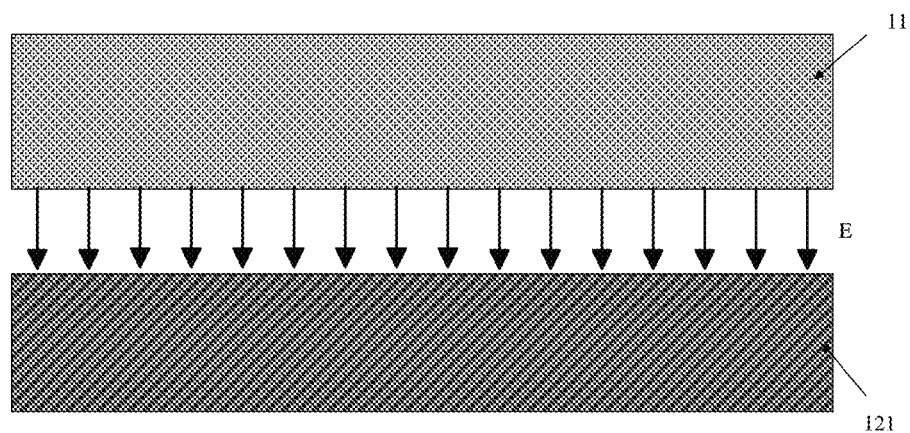
FIGS. 4A-4D are schematic diagrams of touch electrode structures and electric field distribution of the touch electrode structures provided by some embodiments of the present disclosure.
Figure 4B:
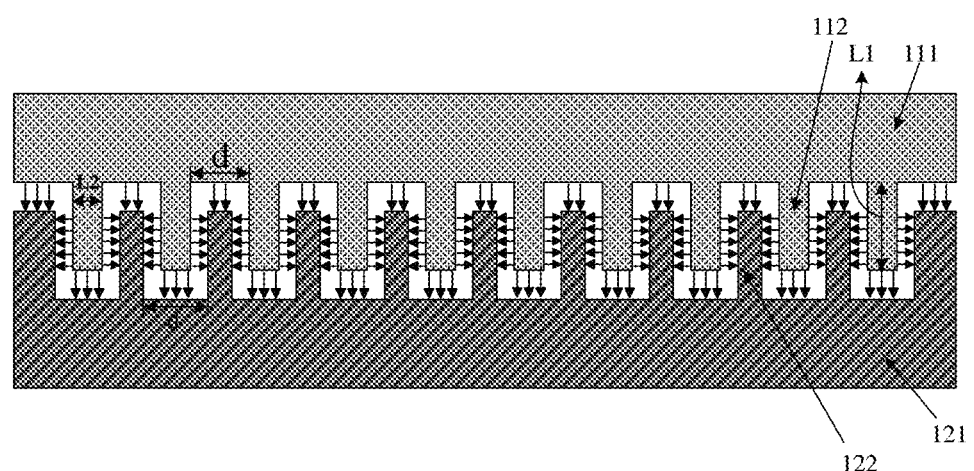
Figure 4C:
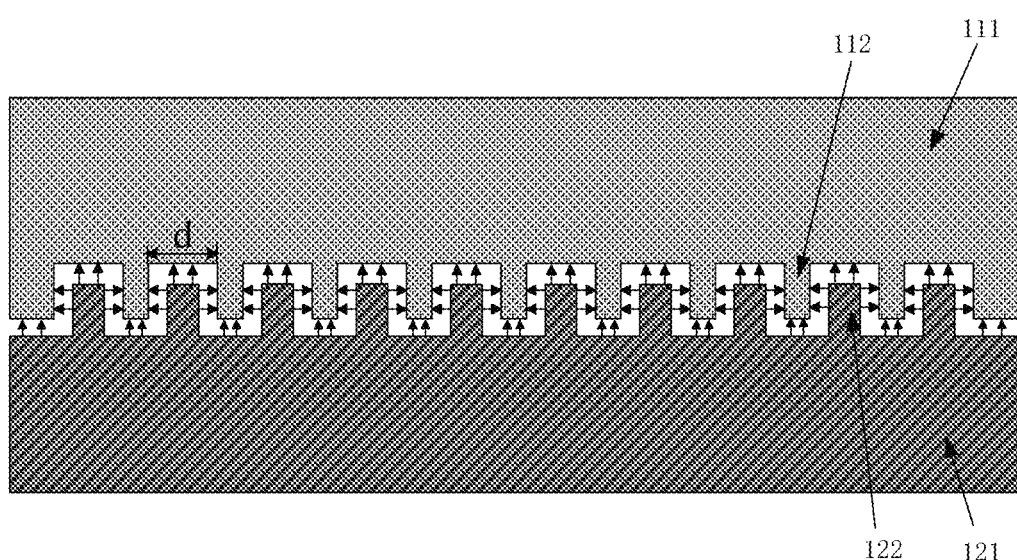
Figure 4D:
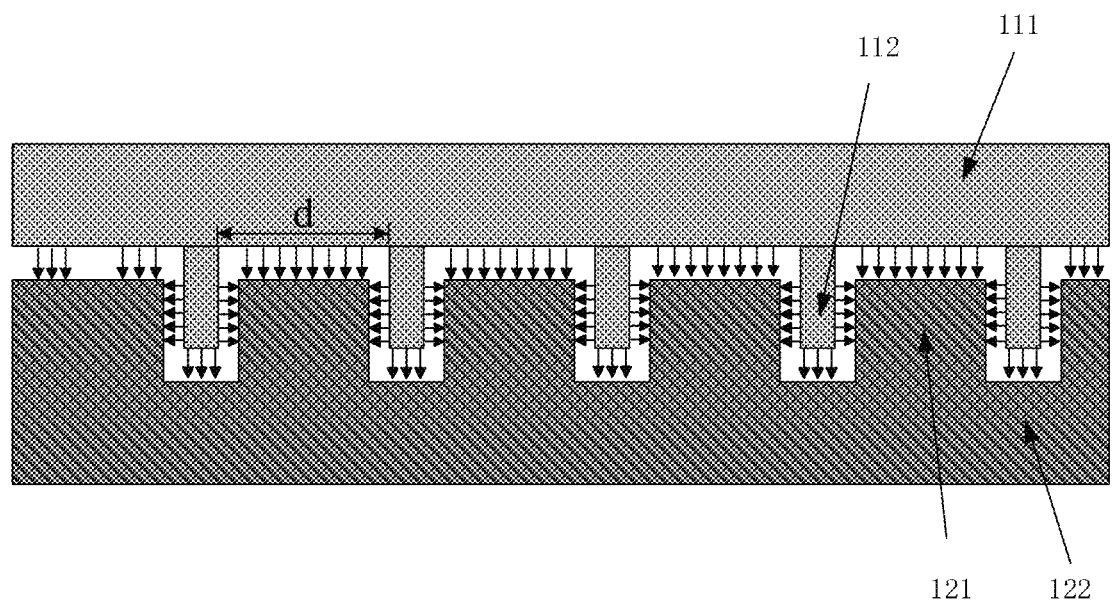

In a certain range, the greater the length of the interdigital structures, the higher the distribution density of the interdigital structures will be and the greater the amount of the interdigital structures will be, and the more the edge length increases and the greater the improvement of mutual capacity will be made. FIGS. 4A-4D schematically illustrate several touch electrode structures and electric field distribution of the touch electrode structures, FIG. 4A schematically illustrates a touch electrode structure without an interdigital structure, and FIGS. 4B-4D schematically illustrate several touch electrode structures provided by embodiments of the present disclosure. For the sake of clarity, only the structure of one edge of the first touch electrode portion 111 and one edge of the second touch electrode portion 121 corresponding the edge of the first touch electrode portion 111 and the electric field coupling between them are shown in the figure. It should be noted that the electrode area of the first touch electrode portion 111 and the electrode area of the second touch electrode portion 121 shown in FIGS. 4A-4D are the same, that is, the self-capacitances of the touch electrode parts are basically the same.

As shown in FIG. 4A, in the case where the edges of the touch electrode parts are not provided with interdigital structures, directions of electric field lines are parallel to each other, and the directions all point from one touch electrode part to another, for example, from the first touch electrode portion 111 to the second touch electrode portion 121.

As shown in FIG. 4B, each first touch electrode portion 111 has ten (10) second interdigital structures 112 on an edge, and each second touch electrode portion 121 has eleven (11) third interdigital structures 122 on an edge. Each second interdigital structure 112 and each third interdigital structure 122 are strip-shaped. A length L1 of each second interdigital structure 112 is about 600 microns. A length of each third interdigital structure 122 is also about 600 microns. A width L2 of each second interdigital structure 112 is about 400 microns. A width of each third interdigital structure 122 is also about 400 microns. A spacing d between adjacent second interdigital structures 112 is about 250 microns. A spacing d between adjacent third interdigital structures 122 is about 250 microns. The term "about" here means approximately and not exactly, and measurement errors within allowable ranged is permitted.

As shown in FIG. 4C, each first touch electrode portion 111 has ten (10) eleven (11) second interdigital structures 112 on an edge, and each second touch electrode portion 121 has ten (10) third interdigital structures 122 on an edge. The length L of each second interdigital structure 112 and each third interdigital structure 122 is 500 microns and the width of each second interdigital structure 112 and each third interdigital structure 122 is 400 microns. A spacing d between adjacent second interdigital structures 112 is 250 microns. Compared with the structure shown in FIG. 4B, the length of each interdigital structure is reduced in FIG. 4C.

As shown in FIG. 4D, each first touch electrode portion 111 has five (5) second interdigital structures 112 on an edge, and each second touch electrode portion 121 has six (6) third interdigital structures 122 on an edge. The length L of each second interdigital structure 112 and each third interdigital structure 122 is 500 microns and the width of each second interdigital structure 112 and each third interdigital structure 122 is 400 microns. A spacing d between adjacent second interdigital structures 112 is 500 microns. Compared with the structure shown in FIG. 4B, the density of the interdigital structure is reduced in FIG. 4D.

Compared with the touch electrode structure without interdigital structures in FIG. 4A, the touch electrode structure shown in FIGS. 4B-4D improves the density of electric field lines between the first touch electrode 111 and the second touch electrode 121 because the interdigital structure increases the coupling area between the first touch electrode 111 and the second touch electrode 121 in the same space, thus increasing the mutual capacity between the first touch electrode 111 and the second touch electrode 121, thus improving the touch sensitivity of the touch electrode structure.

Comparing the touch electrode structures shown in FIG. 4B and FIG. 4C, it can be known that increasing the length L of the interdigital structure also helps to increase the electric field line density between the first touch electrode portion 111 and the second touch electrode portion 121, because increasing the interdigital structure helps to increase the coupling area between the first touch electrode 111 and the second touch electrode 121 in the same space, thus increasing the mutual capacity between the first touch electrode 111 and the second touch electrode 121, thus increasing the touch sensitivity of the touch electrode.

Comparing the touch electrode structures shown in FIG. 4B and FIG. 4D, it can be known that increasing the density of interdigital structures (i.e., reducing the spacing d between adjacent interdigital structures) is also helpful to increase the electric field line density between the first touch electrode 111 and the second touch electrode 121, thus improving the touch sensitivity of the touch electrode structure.

For example, a length L1 of each second interdigital structure 112 ranges from $1/10$ to $1/3$ of a center distance of adjacent first touch electrode portions 111, that is, a distance between center points of adjacent first touch electrode portions 111. For example, the center distance is a pitch P of the touch electrode structure. For an irregular interdigital structure, for example, the length L1 may be an average length, a maximum length or a minimum length of the second interdigital structure 112.

For example, a width L2 of each second interdigital structure 112 ranges from $1/10$ to $1/4$ of the center distance of the adjacent first touch electrode portions 111, for example, $1/10$-$1/4$ of the pitch P of the touch electrode structure. For an irregular interdigital structure, for example, the width L2 may be the average width, the maximum width or the minimum width of the second interdigital structure 112.

For example, the spacing d between adjacent second interdigital structures 112 ranges from $1/20$ to $1/10$ of the pitch P of the touch electrode structure. In case of uneven spacing between adjacent interdigital structures, for example, the spacing d may be an average spacing, a maximum spacing or a minimum spacing of the second interdigital structure 112.

The first touch electrode portion 111 is taken as an example to describe the touch electrode part provided in the embodiment of the present disclosure hereinafter, and such description is also applicable to the second touch electrode portion.

Figure 5:
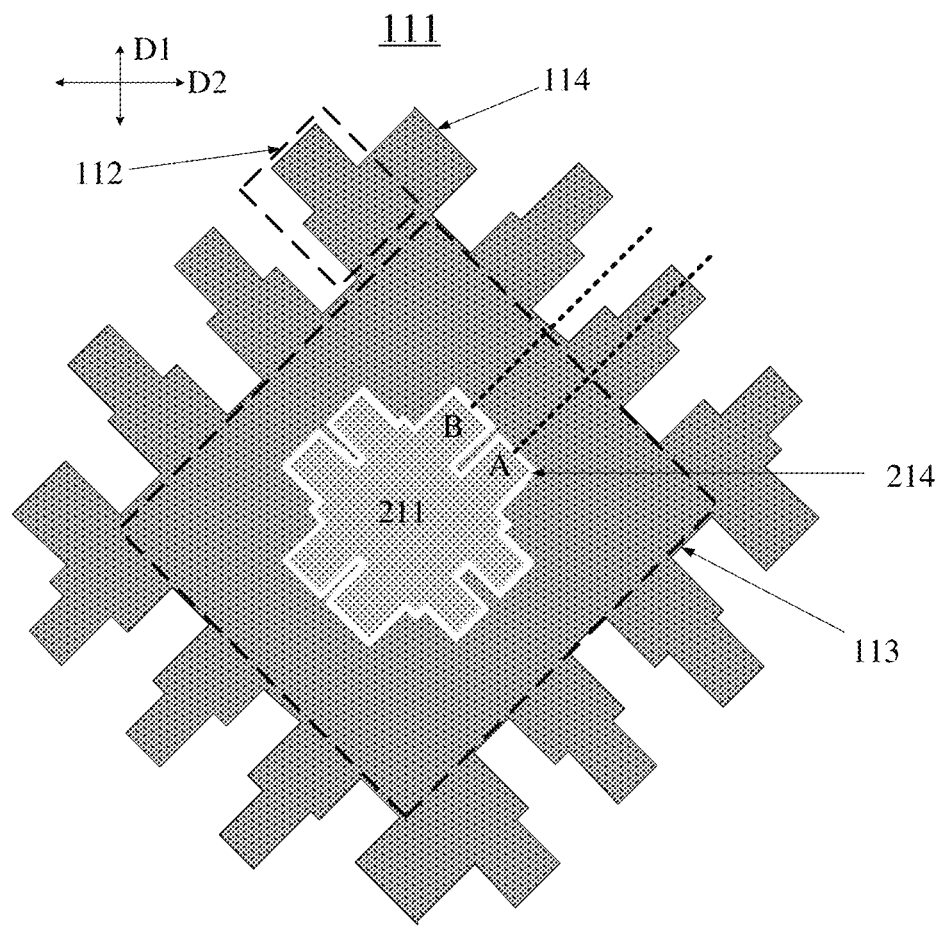
FIG. 5 is a schematic diagram of a first touch electrode provided by some embodiments of the present disclosure.

FIG. 5 shows an enlarged schematic diagram of a first touch electrode portion 111. The first touch electrode portion 111 includes a second body portion 113 and a plurality of second interdigital structures 112 connected to the second body portion 113, and the plurality of second interdigital structures 112 are distributed around the second body portion 113. The second body portion 113 includes a plurality of edges, for example, the second body portion 113 is rectangular. For example, an amount of the second interdigital structures 112 corresponding to each edge is 3-10, such as 6-10.

For example, as shown in FIG. 5, the extending directions of at least one first interdigital structure 214 of the first dummy electrode 211 in the first touch electrode portion 111 and at least one second interdigital structure 112 of the first touch electrode portion 111 are parallel to each other.

For example, as shown in FIG. 5, an extending direction of the first interdigital structure 214 intersects both the first direction D1 and the second direction D2. For example, an extending direction of the second interdigital structure 112 intersects both the first direction D1 and the second direction D2.

For example, as shown in FIG. 5, on each edge of the first body portion of the first dummy electrode 211, one of two adjacent first interdigital structures (A) points to one second interdigital structure 112, and the other (B) points to a gap between two adjacent second interdigital structures 112. That is to say, a center lines of the first interdigital structure A in the length direction and a center lines of the second interdigital structures 112 in the length direction are basically coincided, and a center line of the first interdigital structure B in the length direction is basically coincided with the center line between two adjacent second interdigital structures 112 (as shown by dashed lines in FIG. 5).

For example, the second interdigital structure 112 may have a regular shape or an irregular shape, and may include at least one of rectangle, triangle, and trapezoid. As shown in FIG. 5, each second interdigital structure 112 has a convex shape, that is, a combination of two rectangles; this convex shape further increases the edge length of the first touch electrode portion 111 compared with the shape of a single rectangle.

As shown in FIG. 5, the first touch electrode portion 111 further includes an electrode connection part 114 at a position corresponding to a top corner of the second body portion 113. For example, the electrode connection parts 114 corresponding to two top corners of the second body portion 113 along the first direction D1 are electrically connected to the first touch electrode portions 111 adjacent to the first touch electrode portion 111 through the first connection parts to form the first touch electrode 110 along the first direction D1 (refer to FIG. 6A).

For example, the electrode connection part 114 is directly connected to the nearest second interdigital structure 112.

Figure 6A:
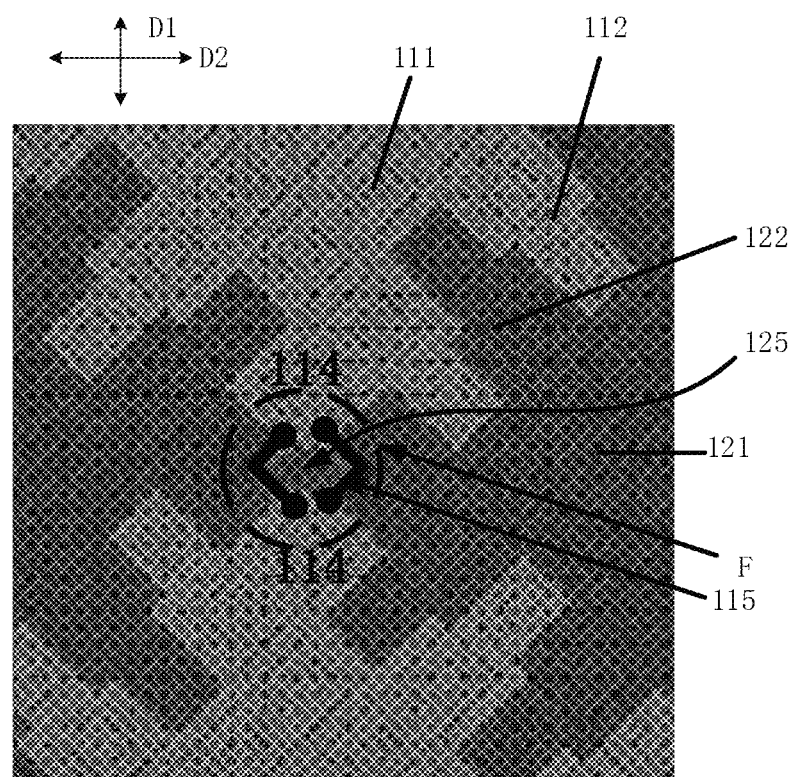
FIGS. 6A-6B are schematic diagrams of touch electrode structures provided by still other embodiments of the present disclosure.

FIG. 6A shows a schematic diagram of a touch unit in the touch electrode structure provided by an embodiment of the present disclosure. As shown in FIG. 6A, along the first direction D1, adjacent first touch electrode portions 111 are electrically connected to each other through the first connection portion 115 to form the first touch electrode 110; in the second direction D2, adjacent second touch electrode portions 121 are electrically connected to each other through the second connection portion 125 to form the second touch electrode 120. For example, the first touch electrode portion 111, the second touch electrode portion 121, and the second connection portion 125 are located in the same layer and are separated from the first connection portion 115 by an insulating layer.

For example, as shown in FIG. 6A, the adjacent first touch electrode portions 111 are electrically connected to each other in the first direction D1 by the first connection part 115. For example, two first connection portions 115 are arranged between every two adjacent first touch electrode portions 111, that is, a dual-channel structure is formed, which can effectively improve the product yield. For example, a position where the signal lines intersect is easy to cause short circuit defect due to electrostatic breakdown of the mutual capacitance, in the case where one channel of the two first connection portions 115 is detected to have short circuit defect in the detection process, the channel can be cut off (for example, by laser cutting), and the circuit structure can still work normally through the other channel.

For example, both of the second touch electrode 110 and the first touch electrode 120 may be block-shaped and made of transparent conductive materials. Both of them may include a grid structure, which is made of metal conductive materials.

Figure 6B:
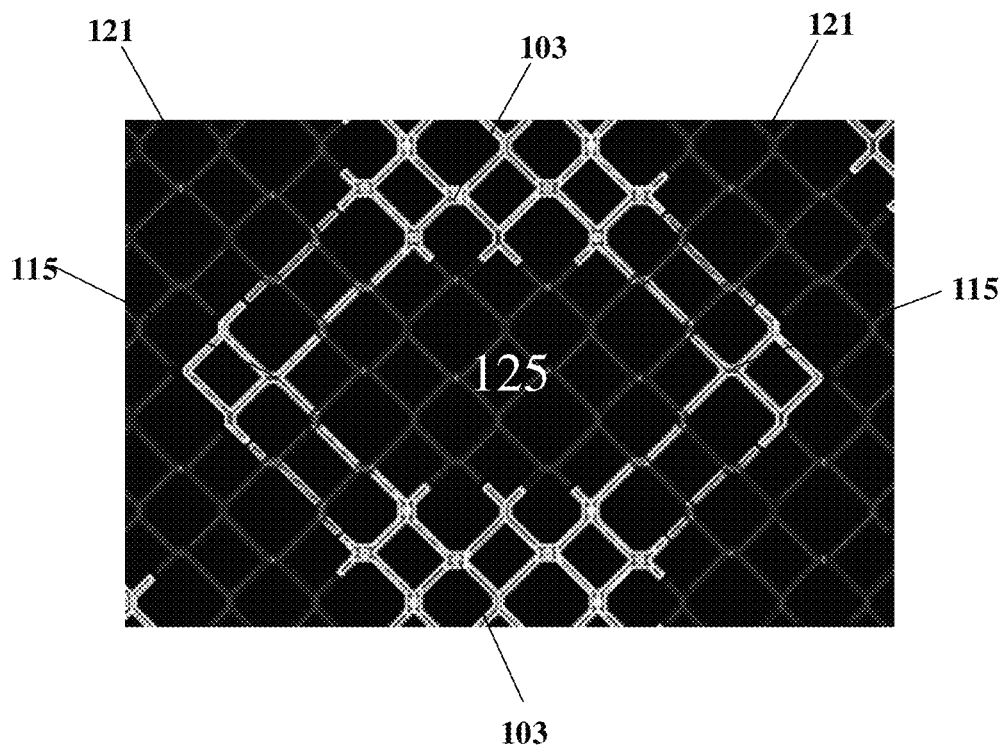

FIG. 6B shows an enlarged schematic diagram of the touch unit at the intersection F of the first touch electrode portion 111 and the second touch electrode portion 121. As shown in FIG. 6B, both the second touch electrode 110 and the first touch electrode 120 have a grid structure. In this figure, the bright mesh structure shows the first connection parts 115 located in the same layer, and the dark mesh structure shows the second touch electrodes 120 (including the second connection part 125 and the second touch electrode portion 121) located around the first connection parts 115 and in a different layer from the first connection parts 115. Between adjacent first touch electrode portions 111, two terminals of two first connection portions 115 are connected, for example, in an integrated network structure. The terminals of the first connection portions 115 respectively overlap with the first touch electrode portions 111 which are connected to the terminals of the first connection portions 115 in a direction perpendicular to the plane of the mesh structure and are electrically connected through the vias 103.

The embodiment of the present disclosure also provides a touch panel, which comprises the above touch electrode structure.

Figure 7:
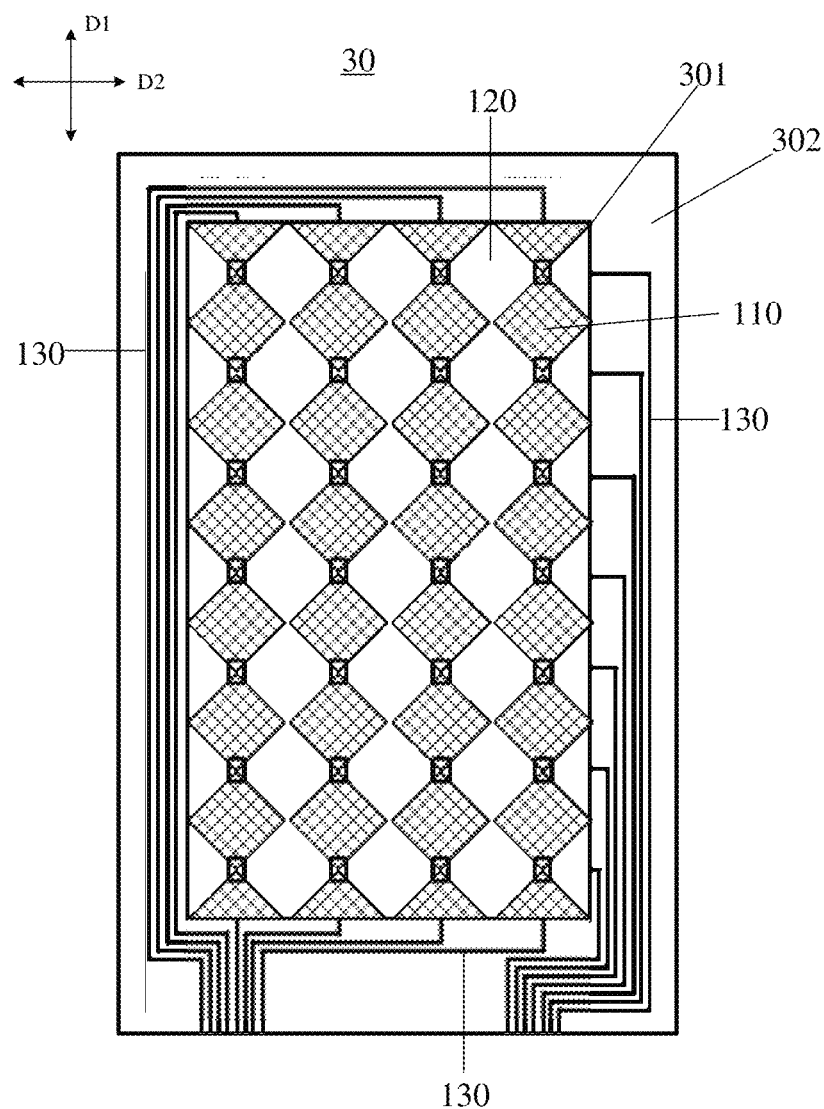
FIG. 7 is a schematic diagram of a touch panel provided by some embodiments of the present disclosure.

FIG. 7 is a schematic diagram of a touch panel according to at least one embodiment of the present disclosure. As shown in FIG. 7, the touch panel 30 includes a touch region 301 and a non-touch region 302 located outside the touch region 301, and the touch electrode structure 20 is located in the touch region 301. For example, the touch region 301 is rectangular, and the length direction of the rectangle is along the first direction D1 and the width direction is along the second direction D2. The first touch electrode 110 extends along the length direction of the rectangle, and the second touch electrode 120 extends along the width direction of the rectangle. For the sake of clarity, the structures of the first touch electrode and the second touch electrode are not shown in detail.

For example, as shown in FIG. 7, the touch panel 30 further includes a plurality of signal lines 130 located in the non-touch region 302. Each first touch electrode 110 and each second touch electrode 120 are electrically connected to a signal line 130, respectively, and are connected to a touch integrated circuit (not shown in the figure) through the signal line. For example, the first touch electrode 110 is a touch driving electrode and the second touch electrode 120 is a touch sensing electrode, but this is not limited by the embodiments of the present disclosure.

The touch integrated circuit is, for example, a touch chip, which is used to provide the touch driving signal to the first touch electrode 110 in the touch panel 30, receive the touch sensing signal from the second touch electrode 120, and process the touch sensing signal to realize a touch detection function.

For example, as shown in FIG. 7, an terminal of the plurality of signal lines 130 connected to the touch integrated circuit can be arranged on the same side of the touch region 301 (for example, a lower side in FIG. 7), which can facilitate the connection with the touch integrated circuit.

For example, as shown in FIG. 7, because the first touch electrode 110 is longer than the second touch electrode 120, in order to improve the signal transmission speed, a signal line 130 can be respectively arranged at both terminals of one first touch electrode 110. During operation, the touch integrated circuit can bidirectionally input touch driving signals (bilateral driving) to one first touch electrode 110 through two signal lines 130, so that the signal loading speed on the first touch electrode 110 can be improved, thereby improving the detection speed.

An embodiment of the present disclosure also provides an electronic device, including the touch electrode structure 20 or the touch panel 30. For example, the electronic device is a touch display panel including a display panel. For example, the touch electrode structure is integrated or arranged outside the display panel. For example, the touch panel and the display panel are integrated in various ways, such as embedded, external, etc.

Figure 8A:
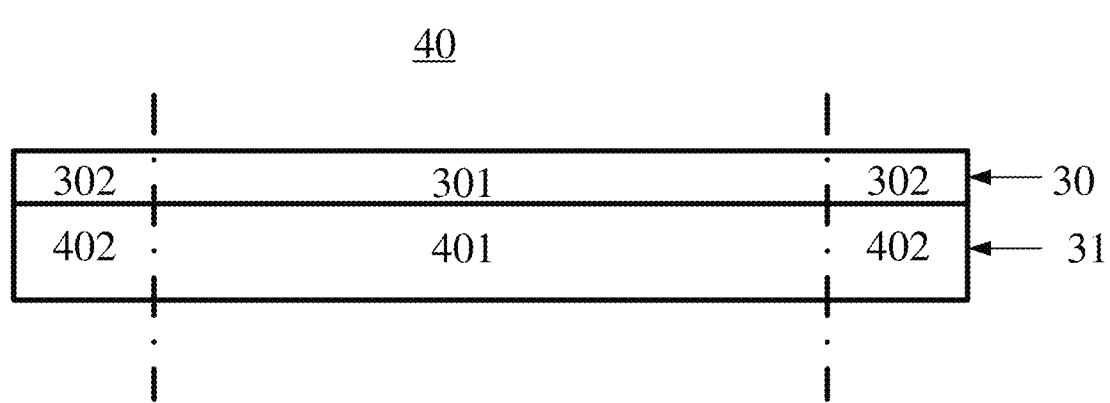
FIG. 8A is a schematic diagram of an electronic device provided by some embodiments of the present disclosure.

FIG. 8A shows a sectional view of an electronic device provided by an embodiment of the present disclosure. For example, the electronic device is a touch display panel 40, which includes a touch panel 30 and a display panel 31, and the display panel 31 and the touch panel 30 are stacked. The display panel 31 includes a display region 401 and a non-display region 401. For example, the display region 401 and the touch region 301 are aligned to correspond to each other, and the non-display region 402 and the non-touch region 302 are aligned to correspond to each other. The display panel 31 and the touch panel 30 are fixed to each other by glue, for example, or integrally formed, that is, the touch panel 30 is directly formed on the display panel 31 with the display panel 31 as a base substrate.

For example, the display panel 31 may be a liquid crystal display panel, an organic light-emitting diode display panel, or an electronic paper display panel.

Figure 8B:
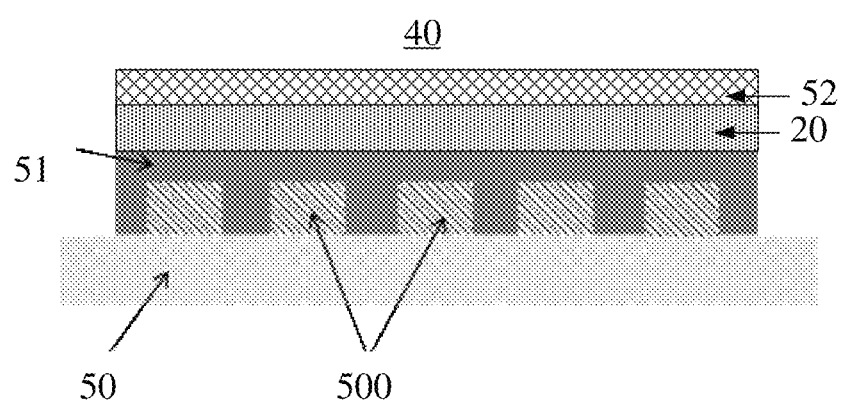
FIG. 8B is a schematic diagram of an electronic device provided by other embodiments of the present disclosure.

FIG. 8B shows a cross-sectional view of an electronic device provided by another embodiment of the present disclosure. As shown in FIG. 8B, the display panel 31 includes a substrate 50 and a light-emitting element 500 located on the substrate 50. The light-emitting element 500 is, for example, an organic light-emitting diode display panel. For example, the substrate 50 includes a pixel circuit (not shown) for driving the light-emitting element 500 to emit light. The display panel 31 further includes an encapsulation layer 51 located on a side of the light-emitting element 500 away from the substrate 50, and the touch electrode structure 20 is located on a side of the encapsulation layer 51 away from the substrate 50. The encapsulation layer 51 is configured to seal the light-emitting element 500 to prevent external moisture and oxygen from penetrating into the light-emitting element and the driving circuit to cause damage to the device. For example, the encapsulation layer 51 includes an organic thin film or a structure in which organic thin films and inorganic thin films are alternately stacked.

For example, the touch electrode structure 20 is directly formed on the encapsulation layer 51. For example, the first connection portion 115 in the touch electrode structure 20 is in direct contact with the encapsulation layer, and at least one insulating layer may be formed between the first connection portion 115 and the encapsulation layer 51.

For example, as shown in FIG. 8B, the display panel 31 further includes a cover plate 50 located on a side of the encapsulation layer 51 away from the substrate 50, and the cover plate 52 is, for example, a glass cover plate or an organic flexible cover plate. The touch electrode structure 20 is located between the encapsulation layer 51 and the cover plate 52.

In other examples, a transparent protective layer (such as transparent optical adhesive) may be used instead of the cover plate 52 to protect the touch electrode structure 20.

Embodiments of the present disclosure also provide a manufacture method for manufacturing the touch electrode structure 20. The manufacture method at least comprises forming a first touch electrode and a second touch electrode; the first touch electrode extends along a first direction, and the second touch electrode extends along a second direction, and the first direction intersects with the second direction; a size of the first touch electrode in the first direction is greater than a size of the second touch electrode in the second direction; the first touch electrode and the second touch electrode intersect with each other to form a mutual capacitance for touch detection; the first touch electrode comprises a first hollow region, and the second touch electrode comprises a second hollow region, a hollow area of the first touch electrode is greater than a hollow area of the second touch electrode; the touch electrode structure also includes at least one first dummy electrode, which is located in the first hollow region and is arranged in the same layer as at least part of the first touch electrode, and the at least one first dummy electrode and the at least part of the first touch electrode are insulated from each other.

The manufacture method of the touch electrode structure provided by the embodiment of the present disclosure will be exemplarily explained with reference to FIGS. 3A-3B.

In an example, the manufacture method at least includes the following steps S801-S803.

Step S801, forming a first connection portion 115 on a base substrate 101.

For example, a first conductive layer is formed on the base substrate 101 and patterned to form the first connection portion 115. For example, the first conductive layer is made of metal materials or alloy materials, such as aluminum, molybdenum, copper, and silver. For example, the material of the first conductive layer is silver palladium copper alloy (APC). For example, the patterning process is a conventional photolithography process, including the steps of coating, exposing, developing, drying, etching, and the like of photoresist.

For example, referring to FIG. 6B, the first connection portion 115 may have a mesh structure.

For example, the base substrate 101 is a flexible substrate, which can be formed of a plastic material with excellent heat resistance and durability. For example, polyimide (PI), polycarbonate (PC), polyethylene glycol terephthalate (PET), polycarbonate, polyethylene, polyacrylate, polycarbonate, polyarylate, polyetherimide, polyethersulfone, polyethylene glycol terephthalate (PET), polyethylene (PE), polypropylene (PP), polysulfone (PSF), Polymethyl methacrylate (PMMA), cellulose triacetate (TAC), cyclic olefin polymer (COP), cyclic olefin copolymer (COC), and the like. Alternatively, the base substrate 101 may also be the display panel itself, in which case the touch electrodes are directly formed on the surface of the display panel to obtain an integrated touch display panel.

Step S802: forming an insulating layer 102 on the first conductive layer and form a via 103 in the insulating layer. For example, the via 103 respectively correspond to the first connection portion 115 and expose at least part of the first connection portion 115 respectively. For example, each first connection portion 115 correspondingly forms two vias 103.

For example, the material forming the insulating layer 102 can be an inorganic insulating material, for example, the inorganic insulating material is a transparent material. For example, the inorganic insulating material is silicon oxide, such as silicon oxide, silicon nitride and silicon oxynitride, silicon nitride or silicon oxynitride, or aluminum oxide, titanium nitride and other insulating materials including metal oxynitride.

For example, the material forming the insulating layer 102 may also be an organic insulating material to obtain good bending resistance. For example, the organic insulating material is a transparent material. For example, the organic insulating material is OCA optical adhesive. For example, the organic insulating material may include polyimide (PI), acrylate, epoxy resin, polymethyl methacrylate (PMMA), etc.

Step S803: forming a second conductive layer on the insulating layer 102 and patterning the second conductive layer to form the first touch electrode portion 110 and the second touch electrode 120.

For example, a plurality of spaced first touch electrode portions 111 are formed along the first direction D1 corresponding to the first connection portion 115, and second touch electrodes 120 (including second touch electrode portions 121 and second connection portions 125) are formed along the second direction D2. An orthographic projection of each first connection portion 115 on the base substrate 101 is located between orthographic projections of two adjacent first touch electrode portions 111 on the base substrate 101 in the first direction D1. Each first touch electrode portion 111 is electrically connected to the corresponding first connection portion 125 through the via 103 to form the first touch electrode 110 extending along the first direction D1. A plurality of first touch electrodes 110 and a plurality of second touch electrodes 120 intersects with each other to form a plurality of touch units.

For example, the second conductive layer is patterned to form a first touch electrode portion 111 and a second touch electrode 120 which are insulated from each other, and a first hollow region 210 is formed in the first touch electrode.

In other examples, the second conductive layer is patterned to form the first touch electrode portion 111 and the second touch electrode 120 which are insulated from each other, and at least one dummy electrode is formed in the first touch electrode, which is insulated from each other at intervals. That is, the patterning process directly forms the first dummy electrode 210 located in the first hollow region. For example, the patterning process etches the whole conductive block into a first part and a second part which are insulated from each other, and the first part is located in the second part to form the dummy electrode; the second part surrounds the first part and forms the first touch electrode portion 111.

For example, the patterning process may form a plurality of first dummy electrodes 210 spaced apart from each other, that is, the first hollow region 210 may include a plurality of first sub-hollow regions 212 spaced apart from each other; the plurality of first dummy electrodes 211 are respectively formed in a one-to-one correspondence in a plurality of first sub-hollow regions 212.

For example, the first hollow region 210 can be formed in the first touch electrode, while the second hollow region and the second dummy electrode can be formed in the second touch electrode, which will not be described in detail here.

For example, the hollow area of the first touch electrode 110 is greater than the hollow area of the second touch electrode 120.

In some examples, the hollow region may be formed only in the first touch electrode and not in the second touch electrode, so that the process may be simplified.

For example, the material of the second conductive layer is a transparent conductive material including transparent conductive metal oxide materials, such as indium tin oxide (ITO), indium zinc oxide (IZO), zinc oxide (ZnO), zinc aluminum oxide (AZO), indium gallium zinc oxide (IGZO), etc.

For example, the material of the second conductive layer may also be a metal material, such as aluminum, molybdenum, copper, silver and other metal materials or alloy materials.

What have been described above merely are specific implementations of the present disclosure, but the protective scope of the present disclosure is not limited to this case. The protective scope of the present disclosure is determined by the appended claims.

What is claimed is:

1. A touch electrode structure, comprising a first touch electrode and a second touch electrode, wherein:
    the first touch electrode extends along a first direction, the second touch electrode extends along a second direction, the first direction intersects with the second direction, and a size of the first touch electrode in the first direction is greater than a size of the second touch electrode in the second direction;
    the first touch electrode and the second touch electrode are insulated from and intersect with each other to form a mutual capacitance for touch detection;
    the first touch electrode comprises a first hollow region, the second touch electrode comprises a second hollow region, and a hollow area of the first touch electrode is greater than a hollow area of the second touch electrode; and
    the touch electrode structure further comprises at least one first dummy electrode, the at least one first dummy electrode is within the first hollow region and is arranged in a same layer as at least part of the first touch electrode, and the at least one first dummy electrode and the at least part of the first touch electrode are insulated from each other;
    wherein the first touch electrode comprises a plurality of first touch electrode portions connected in sequence in the first direction, and the second touch electrode comprises a plurality of second touch electrode portions connected in sequence in the second direction; and
    the plurality of first sub-hollow regions are within the plurality of first touch electrode portions, and the plurality of first dummy electrodes and the plurality of first touch electrode portions are arranged in a same layer and insulated from each other; wherein each first dummy electrode comprises a plurality of first interdigital structures, and each first interdigital structure are embedded in the first touch electrode portion where the first interdigital structure is located in a same plane.

2. The touch electrode structure according to claim 1, wherein an area of the second hollow region is 0.

3. The touch electrode structure according to claim 1, wherein the first hollow region comprises a plurality of first sub-hollow regions spaced apart from each other, and the touch electrode structure further comprises a plurality of first dummy electrodes which are respectively within the plurality of first sub-hollow regions.

4. The touch electrode structure according to claim 3, wherein the second hollow region comprises a plurality of second sub-hollow regions spaced apart from each other, and the touch electrode structure further comprises a plurality of second dummy electrodes which are respectively within the plurality of second sub-hollow regions.

5. The touch electrode structure according to claim 4, wherein areas of the plurality of first sub-hollow regions are identical, and areas of the plurality of second sub-hollow regions are identical.

6. The touch electrode structure according to claim 5, wherein an amount of the plurality of first sub-hollow regions is identical to an amount of the plurality of second sub-hollow regions, and an area of each first sub-hollow region is greater than an area of each second sub-hollow region.

7. The touch electrode structure according to claim 5, wherein an amount of the plurality of first sub-hollow regions is greater than an amount of the plurality of second sub-hollow regions, and an area of each first sub-hollow region is identical to an area of each second sub-hollow region.

8. The touch electrode structure according to claim 1, wherein the first touch electrode and the second touch electrode form a plurality of touch units at intersections, and each touch unit comprises at least one part of each of two first touch electrode portions connected at the intersections and a part of each of two second touch electrode portions connected at the intersections; and
for each touch unit, a total hollow area of the two first touch electrode portions is greater than a total hollow area of the two second touch electrode portions.

9. The touch electrode structure according to claim 1, wherein for each first touch electrode portion, a ratio of the hollow area to an electrode area of the first touch electrode portion ranges from 0.1 to 1.

10. The touch electrode structure according to claim 1, wherein each first dummy electrode comprises a first body portion connected to the plurality of first interdigital structures, and the first body portion comprises a plurality of edges, and each edge corresponds to at least two first interdigital structures.

11. The touch electrode structure according to claim 10, wherein at least one first touch electrode portion where the first dummy electrode is located comprises a plurality of second interdigital structures, and the at least one first touch electrode portion is interdigitated with second touch electrode portions adjacent to the at least one first touch electrode portion in the same plane through the plurality of second interdigital structures to form the mutual capacitance.

12. The touch electrode structure according to claim 11, wherein an extending direction of at least one first interdigital structure of the first dummy electrode and an extending direction of at least one second interdigital structure of the first touch electrode portion where the first dummy electrode is located are parallel to each other.

13. The touch electrode structure according to claim 11, wherein on each edge of the first body portion of the first dummy electrode, one of two adjacent first interdigital structures points to one of the plurality of second interdigital structures, and the other of the two adjacent first interdigital structures points to a gap between the two adjacent second interdigital structures.

14. The touch electrode structure according to claim 11, wherein the first touch electrode portion further comprises a second body portion connected to the plurality of second interdigital structures, and the second body portion comprises a plurality of edges, and an amount of second interdigital structures corresponding to each edge ranges from 3 to 10.

15. The touch electrode structure according to claim 11, wherein an average width of each second interdigital structure ranges from $\frac{1}{10}$ to $\frac{1}{4}$ of a center distance between adjacent first touch electrode portions, and wherein an average length of each second interdigital structure ranges from $\frac{1}{10}$ to $\frac{1}{3}$ of a center distance between adjacent first touch electrode portions.

16. An electronic device, comprising the touch electrode structure according to claim 1 and a display panel, wherein the display panel comprises a substrate, a light-emitting element on the substrate, and an encapsulation layer on a side of the light-emitting element away from the substrate, and the touch electrode structure is on a side of the encapsulation layer away from the substrate.

17. A touch electrode structure, comprising a first touch electrode and a second touch electrode, wherein:
the first touch electrode extends along a first direction, the second touch electrode extends along a second direction, the first direction intersects with the second direction, and a size of the first touch electrode in the first direction is greater than a size of the second touch electrode in the second direction;
the first touch electrode and the second touch electrode are insulated from and intersect with each other to form a mutual capacitance for touch detection;
the first touch electrode comprises a first hollow region, the second touch electrode comprises a second hollow region, and a hollow area of the first touch electrode is greater than a hollow area of the second touch electrode; and
the touch electrode structure further comprises at least one first dummy electrode, the at least one first dummy electrode is within the first hollow region and is arranged in a same layer as at least part of the first touch electrode, and the at least one first dummy electrode and the at least part of the first touch electrode are insulated from each other;
wherein the first touch electrode comprises a plurality of first touch electrode portions connected in sequence in the first direction, and the second touch electrode comprises a plurality of second touch electrode portions connected in sequence in the second direction; and
the plurality of first sub-hollow regions are within the plurality of first touch electrode portions, and the plurality of first dummy electrodes and the plurality of first touch electrode portions are arranged in a same layer and insulated from each other;
wherein adjacent first touch electrode portions are electrically connected through a first connection portion to form the first touch electrode, and adjacent second touch electrode portions are electrically connected through a second connection portion to form the second touch electrode; and
the first touch electrode portion, the second touch electrode portion and the first connection portion are arranged in a same layer and made of a same material, and are separated from the second connection portion by an insulating layer, and adjacent second touch electrode portions are electrically connected by the second connection portion through a via in the insulating layer.

18. A touch panel, comprising a touch electrode structure, wherein the touch electrode structure comprises a first touch electrode and a second touch electrode, wherein:
the first touch electrode extends along a first direction, the second touch electrode extends along a second direction, the first direction intersects with the second direction, and a size of the first touch electrode in the first direction is greater than a size of the second touch electrode in the second direction;

the first touch electrode and the second touch electrode are insulated from and intersect with each other to form a mutual capacitance for touch detection;

the first touch electrode comprises a first hollow region, the second touch electrode comprises a second hollow region, and a hollow area of the first touch electrode is greater than a hollow area of the second touch electrode; and the touch electrode structure further comprises at least one first dummy electrode, the at least one first dummy electrode is within the first hollow region and is arranged in a same layer as at least part of the first touch electrode, and the at least one first dummy electrode and the at least part of the first touch electrode are insulated from each other;

wherein the first touch electrode comprises a plurality of first touch electrode portions connected in sequence in the first direction, and the second touch electrode comprises a plurality of second touch electrode portions connected in sequence in the second direction; and the plurality of first sub-hollow regions are within the plurality of first touch electrode portions, and the plurality of first dummy electrodes and the plurality of first touch electrode portions are arranged in a same layer and insulated from each other; wherein each first dummy electrode comprises a plurality of first interdigital structures, and each first interdigital structure are embedded in the first touch electrode portion where the first interdigital structure is located in a same plane.

* * * * *